US012297558B2

(12) United States Patent
Lau et al.

(10) Patent No.: US 12,297,558 B2
(45) Date of Patent: May 13, 2025

(54) MANUFACTURE AND REPAIR OF HIGH TEMPERATURE REINFORCED SUPERCONDUCTORS

(71) Applicant: LAU Superconductors Inc., Hunt Valley, MD (US)

(72) Inventors: Wayne Chung Wei Lau, Geneva (CH); Kysen Grant Boyd Palmer, Eau Claire, WI (US)

(73) Assignee: LAU Superconductors Inc., Hunt Valley, MD (US)

( * ) Notice: Subject to any disclaimer, the term of this patent is extended or adjusted under 35 U.S.C. 154(b) by 0 days.

(21) Appl. No.: 18/108,461

(22) Filed: Feb. 10, 2023

(65) Prior Publication Data

US 2024/0254652 A1    Aug. 1, 2024

Related U.S. Application Data

(60) Provisional application No. 63/400,674, filed on Aug. 24, 2022, provisional application No. 63/351,668, filed on Jun. 13, 2022, provisional application No. 63/310,309, filed on Feb. 15, 2022.

(51) Int. Cl.
| | | |
|---|---|---|
| *C30B 15/12* | (2006.01) | |
| *C30B 15/30* | (2006.01) | |
| *C30B 15/32* | (2006.01) | |
| *C30B 33/02* | (2006.01) | |

(52) U.S. Cl.
CPC .............. *C30B 15/12* (2013.01); *C30B 15/30* (2013.01); *C30B 15/32* (2013.01); *C30B 33/02* (2013.01)

(58) Field of Classification Search
CPC ......... C30B 15/08; C30B 15/12; C30B 15/30; C30B 15/32; C30B 29/22; C30B 29/60; C30B 33/02
See application file for complete search history.

(56) References Cited

U.S. PATENT DOCUMENTS

| | | | | |
|---|---|---|---|---|
| 3,591,348 | A * | 7/1971 | Le Belle | C30B 15/34 117/25 |
| 4,770,704 | A * | 9/1988 | Gibson | C30B 11/001 164/471 |
| 5,690,734 | A * | 11/1997 | Imaeda | C30B 15/08 117/30 |
| 2009/0289390 | A1* | 11/2009 | Hugo | C30B 29/06 264/81 |
| 2021/0210265 | A1 | 7/2021 | Lau | |

FOREIGN PATENT DOCUMENTS

| | | | | |
|---|---|---|---|---|
| CN | 106735006 A | * | 5/2017 | .......... B22D 11/005 |
| DE | 19740257 | | 1/2006 | |
| JP | H0933966 | | 2/1997 | |
| KR | 20070017748 | | 2/2007 | |

OTHER PUBLICATIONS

English computer translation of CN-106735006-A (Year: 2024).*

* cited by examiner

*Primary Examiner* — Matthew J Song
(74) *Attorney, Agent, or Firm* — Van Pelt, Yi & James LLP

(57) ABSTRACT

A system includes a container and a seed crystal holder. The container is configured to hold melted component powders. The seed crystal holder is configured to hold a seed crystal. The seed crystal holder is configured to put the seed crystal in contact with the melted component powders. The seed crystal holder moves the seed crystal to grow a crystal from the melted component powders.

18 Claims, 6 Drawing Sheets

Radial C-axis Seed Cross-Section

MANUFACTURE AND REPAIR OF HIGH TEMPERATURE REINFORCED SUPERCONDUCTORS

CROSS REFERENCE TO OTHER APPLICATIONS

This application claims priority to U.S. Provisional Patent Application No. 63/310,309 entitled A DIPOLE COILGUN FOR MAGNETICALLY PROPELLING PROJECTILES, MISSILES AND OTHER OBJECTS AND APPLICATIONS OF FIBER REINFORCED HIGH TEMPERATURE SUPERCONDUCTORS AND MANUFACTURING METHODS FOR THE SAME, filed 15 Feb. 2022 which is incorporated herein by reference for all purposes.

This application claims priority to U.S. Provisional Patent Application No. 63/351,668 entitled VARIOUS APPLICATIONS OF REINFORCED HIGH TEMPERATURE SUPERCONDUCTORS, REINFORCED LOW TEMPERATURE SUPERCONDUCTORS, AND MANUFACTURING METHODS FOR THE SAME, filed 13 Jun. 2022 which is incorporated herein by reference for all purposes.

This application claims priority to U.S. Provisional Patent Application No. 63/400,674 entitled VARIOUS APPLICATIONS OF SUPERCONDUCTORS IN SPACE FOR LAUNCHING PROJECTILES AND PAYLOAD TRANSPORT, filed 24 Aug. 2022 which is incorporated herein by reference for all purposes.

BACKGROUND OF THE INVENTION

Launching and propelling objects such as bullets, missiles, space payloads and other projectiles involves explosive chemical reactions involving gunpowder, rocket fuel and other material propellants.

This causes several problems:
  The chemical reactions create explosive shocks, chemicals, and heat which are harmful to nearby humans.
  The chemicals are destroyed and cannot be re-used incurring substantial material expense for each launch.
  The chemical reaction generates excess heat which much be dissipated without harm. This heat accumulates during multiple launches preventing rapid relaunching.
  Material from the chemical reaction must be channel with substantial containment equipment to force the expanding material in a single vector direction along a projectile's axis of movement. This equipment is subject to considerable wear and tear requiring frequent and expensive maintenance and replacement.
  Directing the projectile along its axis requires physical contact with a barrel that generates more heat from friction as well as more equipment wear and tear.
  The reaction generates unusually large noise which not only harms humans but also attracts attention from adversaries looking to locate the launcher.
  The reaction generates unusually large pulses of electromagnetic radiation such as infrared radiation which can attract attention from adversaries looking to locate the launcher.

Also, the first high-temperature superconductor (HTS) was discovered in 1986. Its discoverers were immediately awarded the 1987 Nobel Prize in Physics partly because of expectations for rapid application. Superconductivity is the property of transmitting electricity with no or little resistance. In theory, superconducting materials can also create unlimitedly large magnetic fields.

The HTS break-through was the discovery of superconductivity in ceramic materials. Previously superconductivity was seen only in metallic superconductors which needed to be cooled below 30 K (−243.2° C.) to achieve superconductivity. Such temperatures could in practice be obtained using liquid helium or liquid hydrogen which are expensive to use, increasingly rare in the case of helium, and/or dangerously explosive in the case of hydrogen. In contrast, HTS can achieve superconductivity at temperatures as high as 138 K (−135° C.) and can be cooled using substances such as liquid nitrogen, which is commercially widely available, stable, and inexpensive.

Unfortunately after over three decades of intense experimental and theoretical research, with over 100,000 published papers on the subject and numerous early patents (nearly all expired), no widely accepted theory explains the properties of HTS materials, and no significant HTS applications have been found to be practical.

This reflects four problems: 1) unlike metals which are commonly used to transmit electricity, HTS ceramics are brittle making them expensive to manufacture and difficult to form into wires and other useful shapes; 2) highest performing HTSs are single crystals (bulk) superconductors where the entire sample is a single molecular lattice where superconductivity fails with the slightest lattice crack, 3) HTS do not form large, continuous superconducting domains, but clusters of micro-domains within which superconductivity occurs; and 4) the HTS production process is complicated requiring a multiple calcination of ingredients at high temperatures range from 800° C. to 950° C. for several hours following sintering, which is done at 950° C. in an oxygen atmosphere where oxygen stoichiometry is very crucial for obtaining the superconducting compound.

Slow cooling in an oxygen atmosphere turns the material superconductive involving both the uptake and loss of oxygen.

The complex role of oxygen in production prohibits the use of most reinforcing materials to relieve the brittleness and cracking described above. This is because nearly all potential materials, which are stable across this process' high temperature such as metals, carbon, composites, ceramics, etc., oxidize during this process, which interferes with the creation of the HTS material. The oxidation either creates impurities or depletes oxygen at critical times in the production process and crystal formation.

Current attempts to find useful HTS materials focus on external reinforcement such as packing-in-tube (PIT) wire production, encasing HTS in durable materials like stainless steel, or additive processes such as attempting to apply HTS as a coating on film or tape substrates (Coated). Both PIT and external encasing are difficult to produce economically in shapes and constructions for practical applications. Coated techniques which attempt to grow HTS on reinforcement substrates have limited commercial use and, to date, have not produced significantly robust HTS components for most applications. For example, attempts have been made to use HTS in electrical applications such as Superconductor Fault Current Limiters (SFCL), Superconductor Magnetic Energy Storage (SMES), transformers, and transmission cables where strength is not critical. But these have not yet resulted in widespread HTS for technical and economic reasons.

Attempts have been made to internally reinforce HTS using discontinuous fibers (also known as chopped fibers) and particles. These have generally failed due to a) contamination during production and/or b) agglomeration of the discontinuous particles/fibers during the melt phase of production. For agglomeration, sintering powders are melted into liquid form. When in liquid, discontinuous pieces move and stick together (agglomerate) forming masses which disrupt crystal formation. These agglomerations create cracks and fault planes which reduce the strength of and disintegrate the final HTS crystal. This also causes discontinuous fibers and particles to react with HTS components during HTS formation possibly contaminating the process.

BRIEF DESCRIPTION OF THE DRAWINGS

Various embodiments of the invention are disclosed in the following detailed description and the accompanying drawings.

DETAILED DESCRIPTION

Figure 1:
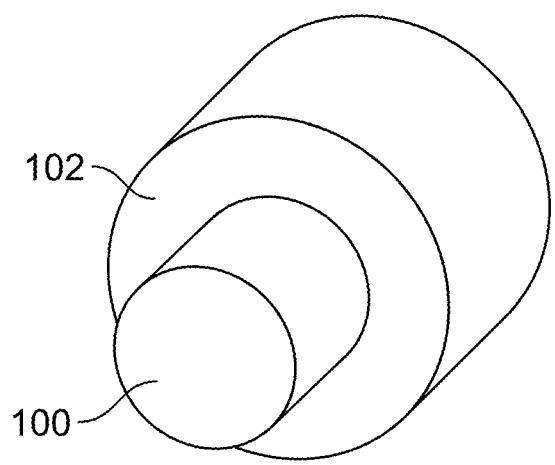
FIG. 1 is a diagram illustrating an embodiment of a precoated fiber for superconductor reinforcement.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents.

Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A system for continuous HTS production is disclosed. The system comprises a crucible, a heating element, a crystallization neck, and a seed crystal holder. The crucible includes a spigot at a bottom end. The heating element is configured to heat the crucible. The crystallization neck is configured to receive melted material from the crucible through the spigot. The crystallization neck provides an output opening for crystalized material. The seed crystal holder is configured to hold a seed crystal in contact with material from the crucible to seed crystal growth.

In some embodiments, a method comprises providing a crucible, a heating element, a crystallization neck, and a seed crystal holder. The crucible includes a spigot at a bottom end. The heating element is configured to heat the crucible. The crystallization neck is configured to receive melted material from the crucible through the spigot. The crystallization neck provides an output opening for crystalized material. The seed crystal holder is configure to hold a seed crystal in contact with material from the crucible to seed crystal growth.

A system for continuous HTS production. The system includes a container and a seed crystal holder. The container is configured to hold melted component powders. The seed crystal holder is configured to hold a seed crystal. The seed crystal holder is configured to put the seed crystal in contact with the melted component powders. The seed crystal holder moves the seed crystal to grow a crystal from the melted component powders.

In some embodiments, a method comprises providing a container and a seed crystal holder. The container is configured to hold melted component powders. The seed crystal holder is configured to hold a seed crystal. The seed crystal holder is configured to put the seed crystal in contact with the melted component powders. The seed crystal holder moves the seed crystal to grow a crystal from the melted component powders.

In some embodiments, a method comprises preparing a seed crystal, melting component powders, causing a crystal to form using the seed crystal and the component powders, and causing the crystal to be annealed.

In some embodiments, the crucible comprises alumina. In some embodiments, the crucible comprises an inner crucible and an outer crucible. In some embodiments, the heating element is disposed between the inner crucible and the outer crucible. In some embodiments, the heating element is one of a plurality of heating elements. In some embodiments, a first heating element of the plurality of heating elements heats to a first temperature and a second heating element of the plurality of heating elements heats to a second temperature. In some embodiments, the system further comprises a cap, wherein the cap is removable and encloses the top of the crucible to capture heat inside the crucible. In some embodiments, the system further comprises one or more sensors for temperature control, wherein data from the one or more sensor is used to adjust crystallization in the crystallization neck. In some embodiments, the seed crystal holder further comprises a fiber holder for holding one or more fibers. In some embodiments, the one or more fibers comprise SiC fibers. In some embodiments, the one or more fibers comprise pre-pacified SiC fibers. In some embodiments, the one or more fibers are heated, cooled, and/or temperature controlled before the crucible and/or after the crystallization neck. In some embodiments, the one or more fibers are prestressed using the seed crystal holder. In some embodiments, the system further comprises a cylinder, wherein the cylinder creates a solenoid from the crystalized material output from the crystallization neck. In some embodiments, the cylinder is rotated and translated to mold the solenoid. In some embodiments, the system further comprises one or more outer rollers maintain contact of the crystalized material output from the crystallization neck with the cylinder. In some embodiments, the system further comprises an annealer, wherein the annealer provides an oxygen flow to anneal the crystalized material. In some embodiments, the annealer provides a heated environment to anneal the crystalized material.

In some embodiments, a reinforced superconductor comprises one or more continuous fibers that is/are embedded in a high temperature superconducting (HTS) material. The fibers are of sufficiently long length or sufficiently large aspect ratio (the ratio of fiber length to width) such that the fibers do not migrate, agglomerate, nor react sufficiently during HTS sintering and crystallization to weaken the final HTS material below that of unreinforced HTS. Fibers can be connected together in structures so that they do not migrate, agglomerate nor react sufficiently during HTS sintering and crystallization to weaken the final HTS material below that of unreinforced HTS. In some embodiments, the fibers are long in the event that the fibers span the HTS from one edge to another. In various embodiments, the fibers are 3, 4, 5, 6, 7, 8, 9, 10, 20, 30, 50 mm long, or any other appropriate length. In some embodiments, the fibers are composed of multiple filaments and/or non-continuous strands which may or may not be composed as threads and/or braids.

In some embodiments, the one or more continuous fibers is/are comprised of an element which a) has a high melting point and b) does not create or cause contamination of a high temperature superconducting material (e.g., a fiber with a specific composition, a fiber with a coating, a fiber with an oxide coating, etc.). In some embodiments, the one or more continuous fibers comprise SiC fiber. In various embodiments, the one or more fibers comprise Silicon (Si), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TIC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), or any other appropriate material. These materials are referred to herein as Reinforcing Materials.

A reinforced high temperature superconducting material is disclosed. The high temperature superconducting material has zero electrical resistance at a temperature above 25° K. In various embodiments, the high temperature superconducting material comprises one or more of the following: a ceramic material, a copper oxide material, a rare earth copper oxide material (RE)BCO (e.g., $(RE)Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). These materials are typically made by heating the component powders in the appropriate proportions until they anneal and then cooling until a crystal is formed. These materials are referred to herein as High Temperature Superconductors or HTS.

In some embodiments, the one or more continuous fibers are arranged in an array. In various embodiments, the array comprises one of the following: a one dimensional array, a two dimensional array, a three dimensional array, or any other appropriate array. In some embodiments, the two or more continuous fibers are connected or coupled to each other. In some embodiments, the two or more continuous fibers are not connected nor coupled to each other. In various embodiments, the one or more fibers are arranged in parallel lines, in parallel curves, or any other appropriate reinforcement arrangement.

In various embodiments, the high temperature superconductive material is shaped using subtractive cutting, is shaped using cutting and dividing, or any other process for creating a shape. In various embodiments, the high temperature superconductive material is produced using a batch process, a continuous process, or any other appropriate process.

In some embodiments, the one or more fibers are prestressed during manufacturing (e.g., put under mechanical tension—for example, by pulling on the ends of the fiber). In various embodiments, the one or more fibers are used for cooling the high temperature superconducting material, are used to heat the high temperature superconducting material, are used to transmit electrical signals into the high temperature superconducting material, or any other appropriate use within the high temperature superconducting material. In some embodiments, the fiber comprises a composite fiber, where the components of the fiber are selected to enhance or be compatible with the property desired (e.g., cooling, heating, and/or transmitting electricity, etc.).

In some embodiments, continuous, long fiber is used for physical internal reinforcement of an HTS material to prevent contamination during crystal formation and cracking of the final crystal which causes the superconductivity of HTS material to fail. Long continuous fiber is distributed through the HTS sintering components powder then processed with the HTS sample through a sintering, crystallization, and cooling process. The use of long continuous fiber prevents problems when fibers agglomerate and react causing weakness in HTS crystal. In some embodiments, discontinuous fibers of approximately 4 mm in length that are added to HTS component powders before sintering physically reinforce an HTS material and prevent contamination during crystal formation and cracking of the final HTS crystal. These agglomerations and reactions are especially acute during the melt phase of HTS crystal production. The length of long continuous fibers, especially when connected or held fixed, prevents the fibers from moving, clumping, and reacting unnecessarily to the detriment of HTS crystal formation. In some embodiments, the fibers are long in the event that the fibers span the HTS from one edge to another and/or just shy of or just beyond or way beyond the edge(s) of the HTS crystal. In various embodiments, the fibers are 3, 4, 5, 6, 7, 8, 9, 10, 20, 30, 50 mm long, or any other appropriate length to prevent agglomeration.

In some embodiments, carbon fiber (e.g., SiC fiber) and/or other fiber is a strong reinforcing material which is stable over the wide range of temperatures involved in sintering, crystallizing and processing bulk HTS crystal;

In some embodiments, although oxygen reacts readily with most materials, the specified fibers create a durable oxide layer that prevents contamination of a high temperature superconducting material. For example, SiC carbon fiber creates a durable layer of silicon dioxide ($SiO_2$) from a reaction of silicon Si with oxygen O during the initial heating of the HTS sintering, in which the component powders are melted into a liquid phase. This $SiO_2$ layer prohibits further reaction with oxygen during the remaining HTS production process. This process is similar to how aluminum (Al), which normally reacts readily with oxygen, forms a durable coat of aluminum oxide $Al_2O_3$, which prevents further reactions. The oxide layer allows aluminum to be used safely for foil, pots, and pans without the fear of either an explosive chemical reaction or aluminum poisoning (except in the case of highly acidic foods like rhubarb which can dissolve the $Al_2O_3$ coating during cooking).

In some embodiments, the use of continuous, long fiber permits the fiber to retain its position in the metal phase liquid and prevents the agglomeration seen with discontinuous fibers and particles, which ultimately weakens and disintegrates the HTS crystal.

In various embodiments, continuous, long fiber can be formed into a variety of simple reinforcement structures involving unconnected fibers such as single planes of one dimensional fiber arrays, two dimensional fiber arrays with alternating stacked layers of planes in orthogonal directions, full three dimensional unconnected arrays or lattices of fibers, or any other appropriate reinforcement arrangements.

In some embodiments, by connecting continuous, long fiber, a variety of reinforcement structures like single and layered two dimensional nets as well as three dimensional connected mesh structures can be made. For example, these structures, nets, or meshes create an internal reinforcement similar to concrete reinforcement that strengthens the material by redistributing stresses and strains, which prevents cracking.

In some embodiments, by using both linear and non-linear, unconnected and connected continuous long fiber, complex reinforcement structures can be formed for any desired geometry of HTS superconductor.

In some embodiments, fiber reinforcement permits HTS components to be produced cheaply and with precision through the technique of Subtractive Sculpting (e.g., the removal of material to achieve a desired shape—for example, by cutting, carving, scraping, grinding, etc.). Until now attempts at producing usable HTS components exclusively focused on either creating thin single crystal films through two-dimensional deposition on substrates or bulk three-dimensional HTS crystals in molds or other fixed containers. These methods are expensive, restrict the shape and size of components, and require the custom manufacture of each component to exact specifications making it extremely difficult to physically modify a component after it is produced. Fiber reinforcement strengthens and reduces the brittleness of a bulk HTS allowing parts to be sculpted (i.e., carved, cut, ground or otherwise extracted away) from a block of HTS material without disrupting the superconductivity of the crystal lattice. Thus, an unlimited variety of HTS component geometries can be produced including wires, rods, spirals, films, tapes, plates, blocks, spheres and three-dimensional complex forms for use in specific electric and magnetic applications. Subtractive Sculpting also allows more precise component manufacture by eliminating geometric uncertainties in thermal expansion/contraction as HTS crystallizes and cools during production. Cooling causes thermal expansion and contraction, which is difficult to predict, and varies greatly depending on an HTS crystal's internal cooling temperature gradients and shape. Production using molds and film deposition are prone to such thermal uncertainties since their external reinforcement cannot be easily modified once the HTS crystal has formed. The much greater manufacturing precision provided by Subtractive Sculpting due to fiber internal reinforcement will allow much less wastage of less-than-perfectly formed HTS components. The efficiency will substantially reduce the cost of fiber reinforced HTS components leading to more commercial applications.

In some embodiments, fiber reinforcement allows a single production block to be cut in to a large number and/or variety of different components. This increases production efficiency and reduces costs leading to more commercial applications.

In some embodiments, fiber reinforcement (e.g., SiC and/or other fiber reinforcement) also makes HTS and proto-HTS materials strong enough for Continuous HTS Production which will significantly reduce manufacturing cost leading to HTS use in more applications. Currently, HTS is produced in batches where single bulk crystals or films are first sintered/deposited then allowed to cool under controlled conditions to allow crystal growth. While suitable for research, batch production is inefficient and expensive requiring considerable labor for each batch and leaving most equipment unused during each production run. Continuous HTS Production is a multi-stage process where: 1) fiber reinforcement is placed within a continuous tube sheath or are formed into a shape by compression prior to or at the entrance to the continuous production line, 2) constituent HTS chemicals in sintering powder form are mixed and place with the fiber reinforcement in the tube or shape, 3) the HTS is then packed and heated to sintering temperatures as the tube or shape is moved through a processing oven machine, 4) the tube or shape then moves through a cooling process where a single long HTS crystal continuously forms, 5) once crystallized, the continuous HTS crystal tube or shape is cooled to room temperature, and 6) the HTS tube or shape is then cut at intervals to produce individual bulk single crystal HTS blocks. The individual blocks are then Subtractively Sculpted into individual components.

Continuous production requires that the single HTS crystal be strong enough to withstand the strains and stresses of continuous movement during production. This is done by placing fiber reinforcement with the sintering component powders in the continuous tube or shape before sintering. The reinforcement reduces the brittleness of and strengthens the HTS such that the continuous tube of HTS can be transported seamlessly through mixing, packing, sintering, cooling, and cutting without breaking the HTS' essential single crystal structure.

In various embodiments, features of the reinforced HTS material include:
  using continuous, long fiber silicon carbide fiber to reinforce HTS to prevent contamination during crystal formation and cracking of the HTS crystal;
  using unconnected continuous, long fibers placed in arrays to reinforce and strengthen HTS; and
  using connected continuous, long fibers placed in two and three dimensional reinforcement structures.

In various embodiments, reinforced HTS material are produced using:
  Subtractive Sculpting, where HTS material is extracted through a sculptive process rather than the additive process of external molding and film/tape deposition which will increase production efficiency and reduce costs leading to more commercial applications;
  Cutting and dividing single HTS blocks into a large number and/or variety of different components which will increase production efficiency and reduce costs leading to more commercial applications;
  Continuously Producing HTS to significantly reduce production cost and time compared to current batch production;

FIG. 1 is a diagram illustrating an embodiment of a precoated fiber for superconductor reinforcement. In the example shown, fiber 100 is coated with coating 102. In some embodiments, fiber 100 that is used for reinforcement can be treated by heat, chemical deposition, or other processes to form coating 102 such as a durable oxide surface layer that prevents contamination and reaction with superconductors and their components during superconductor production herein referred to as precoated reinforcement fiber. In some embodiments, fiber 100 comprises a SiC fiber, which is heated under atmosphere or in oxygen rich gas such that silicon in the SiC reacts with oxygen to form a durable coating (e.g., a layer of silicon oxide). The precoated reinforcement fiber is added to components before superconductor manufacture thus eliminating the need for a reinforcement passivation reaction during component melting. This simplifies reinforced superconductor production and reduces the risk of contamination, secondary crystal seeding, and other mishaps which could affect final superconductor strength and performance.

In some embodiments, reinforcement fiber (e.g., precoated reinforcement fiber or non-precoated reinforcement fiber) can be used in Low Temperature and Type 1 Superconductors to improve strength, heat conduction, and facilitate manufacture. In some embodiments, the reinforcement fiber is SiC (e.g., with or without a SiO coating). In various embodiments, Low Temperature and Type 1 Superconductors include Nb, Pb, $Ba_8Si_{46}$, $C_6Ca$, $C_6Li_3Ca_2$, $C_6Yb$, $C_{60}C_{S2}Rb$, $C_{60}K_3$, $C_{60}Rb_x$, $MgB_2$, $Nb_3Al$, $NbC_{1-x}N_x$, $Nb_3Ge$, NbN, $Nb_3Sn$, NbTi, TiN, $V_3Si$, $YB_6$, ZrN, $ZrB_{12}$, and any other appropriate superconducting material.

Figure 2:
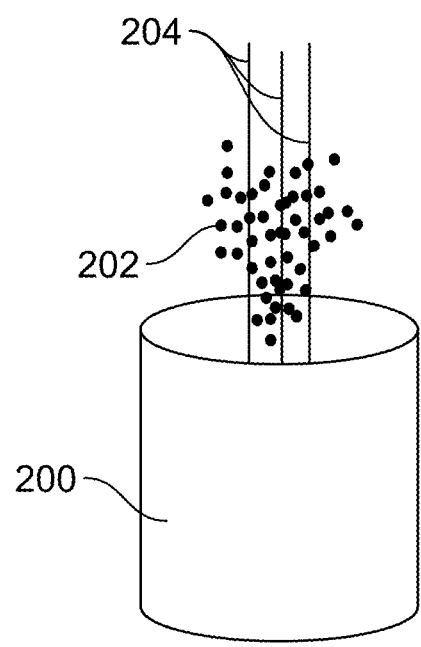
FIG. 2 is a diagram illustrating an embodiment of superconducting manufacturing using long continuous reinforcement fibers.

FIG. 2 is a diagram illustrating an embodiment of superconducting manufacturing using long continuous reinforcement fibers. In the example shown, superconducting material 202 is packed into tube 200 with fibers 204. Fibers 204 are used to reinforce superconducting material 202. In some embodiments, fibers 204 are placed in superconducting material 202 prior to melting and annealing of superconducting material 202. In some embodiments, fibers 204 are precoated or non-precoated as described in FIG. 1.

Figure 3:
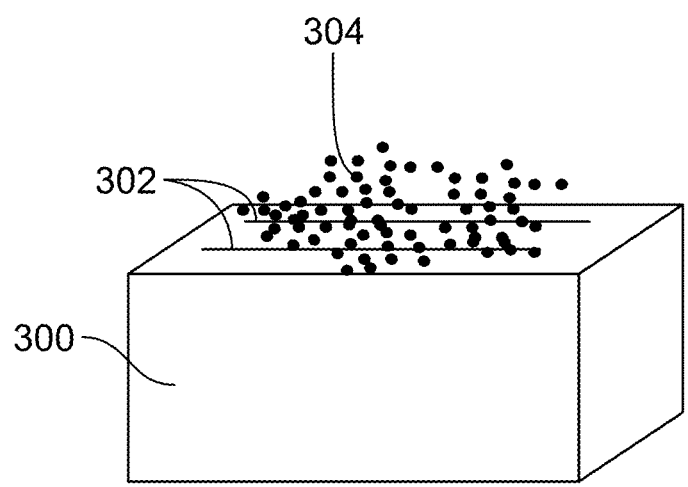
FIG. 3 is a diagram illustrating an embodiment of superconducting manufacturing using long continuous reinforcement fibers.

FIG. 3 is a diagram illustrating an embodiment of superconducting manufacturing using long continuous reinforcement fibers. In the example shown, superconducting material 304 is vapor deposited on substrate 300 with fibers 302. Fibers 302 are used to reinforce superconducting material 304. In some embodiments, fibers 302 are placed in superconducting material 304 prior to melting and annealing of superconducting material 304. In some embodiments, fibers 302 are precoated or non-precoated as described in FIG. 1.

Figure 4:
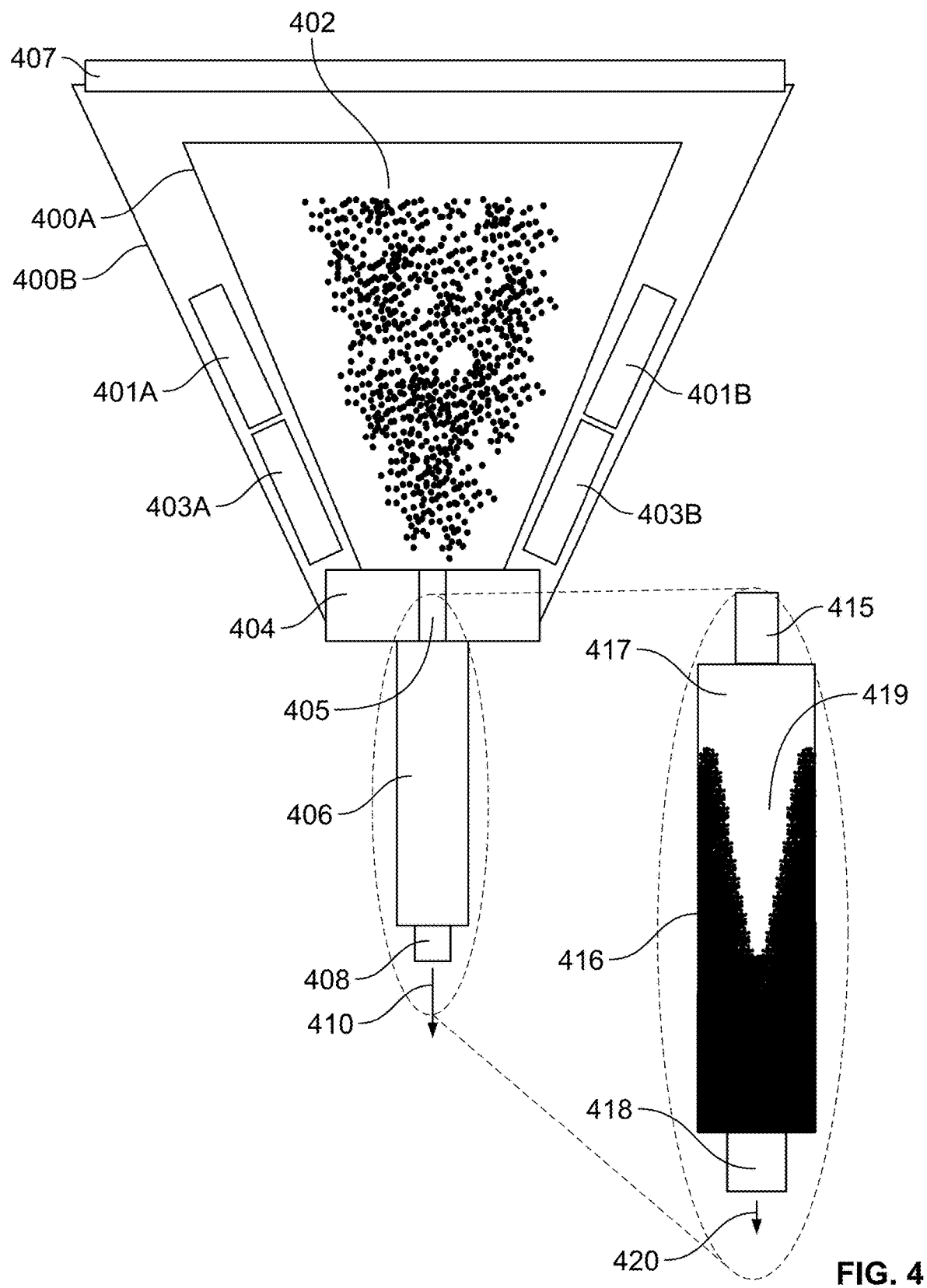
FIG. 4 is a diagram illustrating an embodiment of continuous high temperature superconductor (HTS) production.

FIG. 4 is a diagram illustrating an embodiment of continuous high temperature superconductor (HTS) production. In the example shown, HTS component powders 402 are input to inner crucible 400A (e.g., input after removing heat cap 407). In some embodiments, HTS component powders 402 are heated in inner crucible 400A using one or more heating elements (e.g., stage 1 heating element 401A, stage 1 heating element 401B, stage 2 heating element 403A, stage 2 heating element 403B, and stage 3 heating element 404). The one or more heating elements are surrounded in turn by outer crucible 400B. In some embodiments, heat cap 407 is used to contain heat inside the crucibles (e.g., inner crucible 400A and/or outer crucible 400B). In some embodiments, inner crucible 400A and/or outer crucible 400B are made of alumina. In some embodiments, stage 1 heating element 401A and stage 1 heating element 401B create heat in the range of 400-600° C. In some embodiments, stage 2 heating element 403A and stage 2 heating element 403B create heat in the range of 400-600° C. In some embodiments, stage 3 heating element 404 creates heat in the range of 1200° C. HTS component powders 402 are melted and flow down by the force of gravity (e.g., in direction 410 through spigot 405) and cool in crystallization neck 406 to become a single crystal HTS with a particular orientation (e.g., axial a-b axis) by seeding the crystallization with a seed crystal in seed crystal holder 408 (e.g., a HTS seed crystal with long vertical axial a-b axis). In some embodiments, seed crystal holder 408 is used to pull seed crystal as the crystal is formed and continuously produced (e.g., seed crystal is held—for example, mechanically and/or adhesively held). Crystallization neck 406 is shown enlarged as crystallization neck 416 with spigot input orifice 415. Melted component powders 402 enter crystallization neck 416 in a liquid phase at top zone 417 of crystallization neck 416 and crystallize at the walls of crystallization neck near location 419. At the bottom of crystallization neck, the melt is entirely crystallized and in contact with an HTS seed crystal held in seed crystal holder 418 (e.g., to seed crystal growth). In various embodiments, seed crystal holder 408 and/or seed crystal holder 418 comprises a mechanical holder (e.g., a clamp, a pincer, a basket, etc.) or a platform (e.g., a piston, a table, a table with a clamp, etc.) that has controlled motion (e.g., lowering at a rate, pulling at a rate, etc.), or any other holder for a seed crystal with motion capability.

Figure 5:
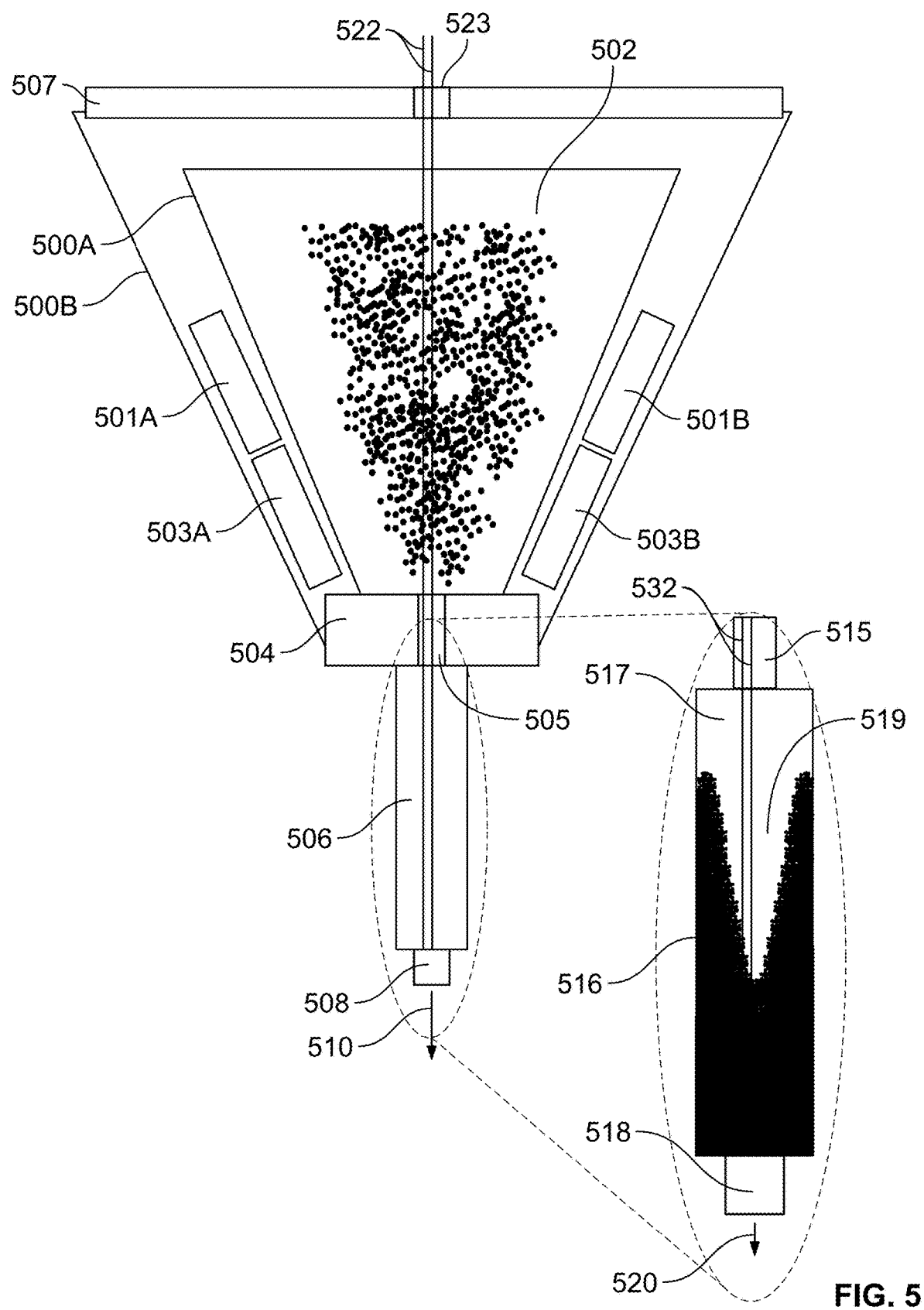
FIG. 5 is a diagram illustrating an embodiment of continuous fiber reinforced high temperature superconductor (HTS) production.

FIG. 5 is a diagram illustrating an embodiment of continuous fiber reinforced high temperature superconductor (HTS) production. In the example shown, HTS component powders 502 are input to inner crucible 500A (e.g., input after removing heat cap 507). In some embodiments, HTS component powders 502 are heated in inner crucible 500A using one or more heating elements (e.g., stage 1 heating element 501A, stage 1 heating element 501B, stage 2 heating element 503A, stage 2 heating element 503B, and stage 3 heating element 504). The one or more heating elements are surrounded in turn by outer crucible 500B. In some embodiments, heat cap 507 is used to contain heat inside the crucibles (e.g., inner crucible 500A and/or outer crucible 500B). In some embodiments, inner crucible 500A and/or outer crucible 500B are made of alumina. In some embodiments, stage 1 heating element 501A and stage 1 heating element 501B create heat in the range of 400-600° C. In some embodiments, stage 2 heating element 503A and stage 2 heating element 503B create heat in the range of 400-600° C. In some embodiments, stage 3 heating element 504 creates heat in the range of 1200° C. HTS component powders 502 are melted and flow down by the force of gravity (e.g., in direction 510 through spigot 505) and cool in crystallization neck 406 to become a single crystal HTS with a particular orientation (e.g., axial a-b axis) by seeding the crystallization with a seed crystal in seed crystal holder 508 (e.g., a HTS seed crystal with long vertical axial a-b axis). Crystallization neck 506 is shown enlarged as crystallization neck 516 with spigot input orifice 515. Melted component powders 502 enter crystallization neck 516 in a liquid phase at top zone 517 of crystallization neck 516 and crystallize at the walls of crystallization neck near location 519. At the bottom of crystallization neck, the melt is entirely crystallized and in contact with an HTS seed crystal held in seed crystal holder 518 (e.g., to seed crystal growth). Fibers 522 (e.g., a SiC fiber, a passivated SiC fiber with oxide coating, etc.) are pulled down through the continuous process system (e.g., through cap hole 523, through inner crucible 500A, through spigot 505 or input orifice 515, through crystallization neck 506 and/or crystallization neck 516, through top zone 517, through seed crystal holder 508 and/or seed crystal holder 518, etc.) so that when component powders 502 melt and then anneal, fibers 522 reinforce the material. In some embodiments, seed crystal holder 508 is used to pull down fibers (e.g., fibers 522 are held in conjunction with a seed crystal—for example, a fiber holder for holding one or more fibers as integrated with a seed crystal and/or mechanically held along with the seed crystal). Similarly, in the enlarged view, fibers 532 (e.g., a SiC fiber, a passivated SiC fiber with oxide coating, etc.) are pulled down through crystallization neck 51 so that when melted component powders 502 anneal, fibers 532 reinforce the material.

In some embodiments, fibers 522 and/or fibers 532 are heated, cooled, and/or held to a specific temperature and/or temperature profile to aid in the annealing process. In some embodiments, fibers 522 and/or fibers 532 are heated, cooled and/or temperature controlled using heating and/or cooling element (e.g., in rollers guiding, pushing, and/or pulling the fibers before the crucible and/or after the annealing stages of the system). In some embodiments, sensors for component powder temperature and/or crystallization progress are used to determine temperature for fiber(s) and a processor controls heating and/or cooling elements to adjust fiber temperature. In some embodiments, seed crystal holder 508 and/or seed crystal holder 518 is/are used for heating and/or cooling fibers 522 and/or fibers 532. In various embodiments, seed crystal holder 508 and/or seed crystal holder 518 comprises a mechanical holder (e.g., a clamp, a pincer, a basket, etc.) or a platform (e.g., a piston, a table, a table with a clamp, etc.) that has controlled motion (e.g., lowering at a rate, pulling at a rate, etc.), or any other holder for a seed crystal and/or fiber with motion capability.

In some embodiments, fibers 522 and/or fibers 532 are prestressed (e.g., put under tension to aid in the final annealed material strength characteristic. In some embodiments, the prestressing is performed using rollers guiding, pushing, and/or pulling the fibers before the crucible and/or after the annealing stages of the system. In some embodiments, the seed crystal holder is used for mechanically pulling fibers 522 and/or fibers 532.

In various embodiments, fibers 522 and/or fibers 532 comprise one or more of the following: a single fiber, a multifilament fiber, a braided fiber, and/or any other fiber, fiber structure, or other appropriate combination of fiber or fiber structure.

In some embodiments, crystallization of component powders (e.g., component powders 402 and/or component powders 502) is controlled by varying a) external annealing temperatures, b) drop length and annealing duration, and c) internal heat conduction through fiber, if appropriate. In some embodiments, the system controls heating/cooling and material feeds based at least in part on sensor readings (e.g., temperature sensors, environment sensors, timing sensors, etc.). Sonic and/or electromagnetic (e.g., X-ray) cross-section scanning can be used to monitor and control crystallization and tempering. Measurements of crystallization diameter thickness can be used to vary a) annealing temperature, b) drop length which changes cooling temperature and annealing duration, and c) internal heat conducted by reinforcement fibers. In some embodiments, a processor is used to receive these indications and appropriately adjust material feeds, environment temperatures, etc. to maintain appropriate material processing and production of HTS.

In some embodiments, component powders 502 maintain mixture through either mechanical forced mixing or the continuous addition of new material and melting and drawing off of existing elements through the continuous process. HTS powders are generally a mixture of two types of particles and these are premixed prior to melting and would provide two separate aspects specific to this manufacturing process in addition to their superconducting properties. These two aspects are: stability to the forming crystal and a liquid phase that allows for flow and creation of continuous crystal.

in some embodiments, the seed crystal may be oriented in any direction, and additional seed crystals may be used along the continuous length to help restore or reaffirm crystal direction or formation efficacy. In some embodiments, a seed crystal is used to change the crystal orientation at fixed points along the length or to create boundaries at known locations where the crystal structure has a change.

In some embodiments, the seed crystal and attached forming crystal structure can be drawn (e.g., mechanically by hand, using an automated mechanism, etc.). In some embodiments, the automated mechanism for drawing the seed crystal (e.g., via the seed crystal holder—such as seed crystal holder 508 and.or 518) and attached crystal structure is able to control speed and tension of draw in order to create a more uniform HTS continuous crystal. In some embodiments, the crystal structure is in a rod form in the case where the crystal formed is of sufficient thickness to prevent winding in coils. In some embodiments, winding of the crystal structure is possible and the mechanical draw involves a seed crystal placement on a drum to allow for long, continuous wires to be created through continuous rotary motion. In some embodiments, this winding of the crystal structure on a drum enables coil production. In some embodiments, the winding of the crystal structure creates HTS fiber on a spool. In some embodiments, the draw speed, heat, tension, and other mechanics of wire drawing process determine HTS fiber diameter and uniformity. In some embodiments, production parameters (e.g., speed, heat, tension, etc.) are monitored through either sensors or other mechanisms to control production of the crystal.

In some embodiments, the continuously produced HTS material passes through a secondary oxygen annealing. In some embodiments, the oxygen annealing occurs during continuous production as the material is drawn into a solid crystal structure using a secondary chamber with a flow of oxygen across the HTS at temperatures appropriate for the material (e.g., 600° C. for some (RE)BCO). In some embodiments, the travel time through the annealing chamber is dependent upon crystal thickness and other physical aspects including the component mixture and temperature.

Figure 6A:
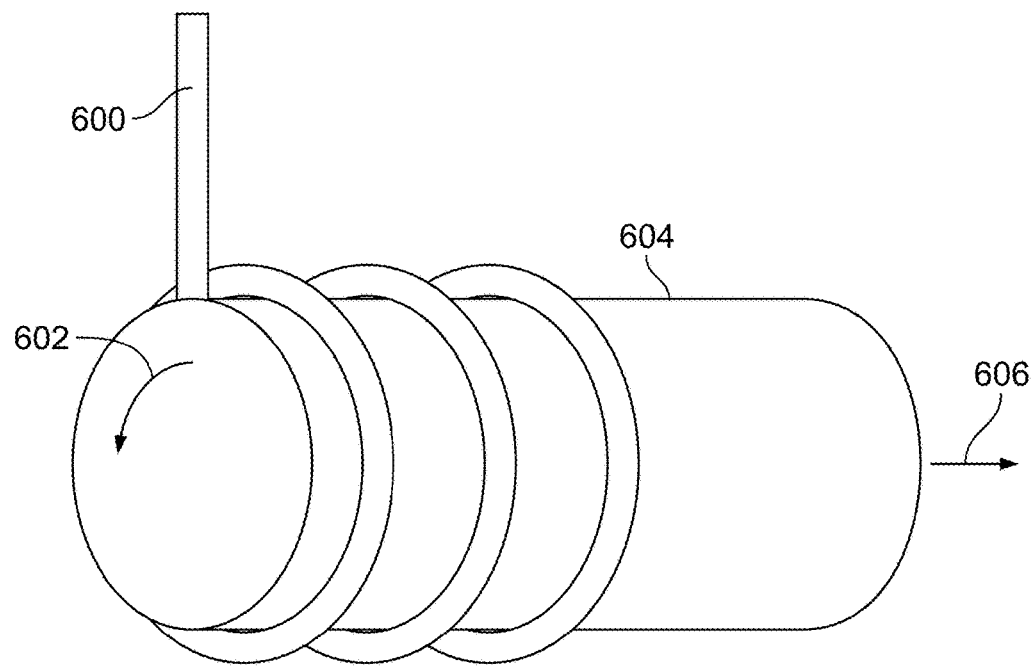
FIG. 6A is a diagram illustrating an embodiment of continuous high temperature superconductor (HTS) solenoid production.

FIG. 6A is a diagram illustrating an embodiment of continuous high temperature superconductor (HTS) solenoid production. In the example shown, HTS Solenoids are produced by cylinder rotation when the continuously produced HTS conductor 600 (e.g., the output of process shown in FIG. 4 or FIG. 5) is still partially melted. Final crystallization of the HTS single crystal with long axis a-b conducting planes is on the surface of cylinder 604 that molds the final solenoid shape while rotating in direction 602 and translating in direction 606. In some embodiments, reinforcement is made more ductile for cylinder rolling of continuously produced HTS conductor 600 by using reinforcement chains with links or loops made of fiber. In some embodiments, one or more outer rollers or any other guides are used to maintain contact of the continuously produced HTS conductor 600 on the surface of cylinder 604.

Figure 6B:
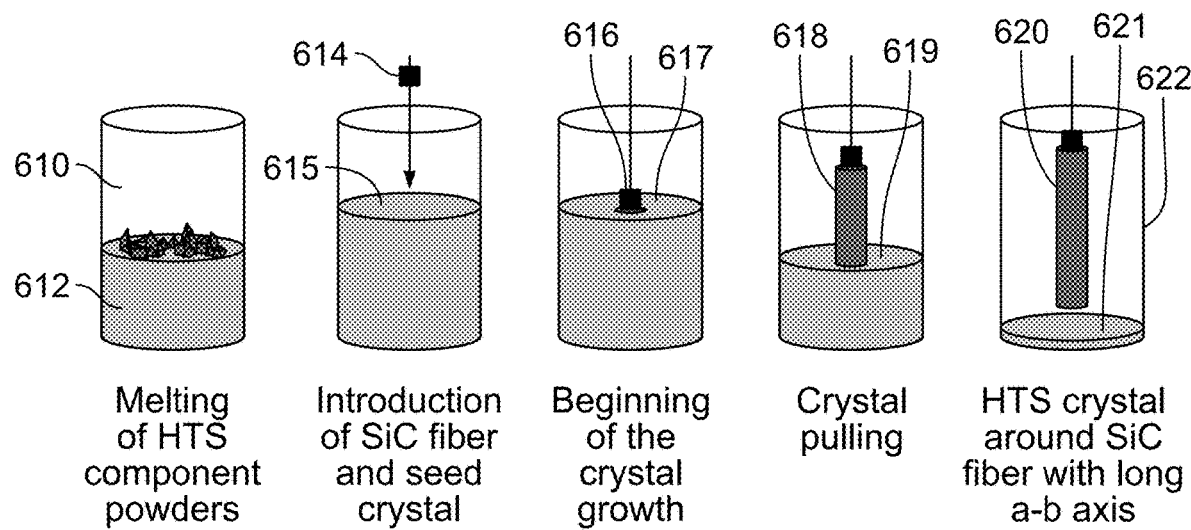
FIG. 6B is a diagram illustrating an embodiment of stages of continuous high temperature superconductor (HTS) production.

FIG. 6B is a diagram illustrating an embodiment of stages of continuous high temperature superconductor (HTS) production. In the example shown, in stage 1, HTS component powders 612 are melted in container 610 (e.g., the container includes heating elements for melting). In stage 2, seed crystal 614 and one or more fibers are introduced into melted component powders 615 (e.g., a seed crystal being held using attached fiber(s) (a seed crystal holder) are introduced to start annealing a crystal—for example, one or more fibers into the melt and a seed crystal in contact with the melted component powders at the top of the melt). In some embodiments, the seed crystal holder holds a seed crystal and one or more fibers to control spinning and pulling of the grown crystal. In stage 3, seed crystal 616 is in contact with melted component powders 617 and crystal growth happens around seed crystal 616 (e.g., the seed crystal holder pulls the seed crystal to grow an annealed crystal from the melted component powders). In some embodiments, seed crystal 616 is rotated during crystal growth. In stage 4, new crystal 618 is pulled from melted component powders 619. In stage 5, new crystal 620 is separated from melted component powders 621 or there are no more remaining melted component powders in container 622 and the process terminates.

In some embodiments, the system involves drawing fibers through a liquid composed of heated HTS component powders before HTS crystallization. In some embodiments, fibers may undergo passivation during the drawing process. In some embodiments, the fibers may be pre-pacified through a process which pre-coats the fiber with a durable oxide pacification coat. In some embodiments, the fiber can be SiC fiber which has been treated by heat, chemical deposition or other means to have a durable silicon oxide coat which acts as passivation for the fiber during HTS crystallization.

In some embodiments, fiber in the system described in FIG. 6B is rotated to adjust cooling, liquid phase epitaxy, or the thickness of resulting HTS crystal. In some embodiments, the system controls spinning speed and material feeds based at least in part on sensor readings (e.g., temperature sensors, environment sensors, timing sensors, etc.). In some embodiments, a processor is used to receive these indications and appropriately adjust spinning speeds, material feeds, environment temperatures, etc. to maintain appropriate material processing and production of HTS.

In some embodiments, the system described in FIG. 6B is used with spirals of reinforcement fiber to make solenoids. A single wire reinforcement spiral used will produce a single wire HTS solenoid. Individual wire HTS solenoids can be wound together to make a single combined magnetic field. Both pre-pacified coated fiber or uncoated fiber can be used.

In some embodiments, the system described in FIG. 6B is used with complex fiber structures such as nets, cages, and meshes to create single crystal HTS components with complex internal reinforcement. For example, HTS cylinders used in induction Superconducting Fault Current Limiters will see radial Lorentz forces when a magnetic field is applied along its non-conducting c-axis. These radial forces can cause the HTS cylinders to burst ending superconductivity. Reinforcement fibers oriented in a radial direction perpendicular to the c-axis will increase radial strength raising performance limits. Such radial reinforced HTS crystal can be made using fiber cages in the system described in FIG. 6B with radial internal fiber arms. Both pre-pacified coated fiber or uncoated fiber can be used.

In some embodiments, single wire reinforcement spirals and complex fiber structures such as nets, cages, and meshes to create complex internal reinforcement can be made by depositing fiber material on a model core. The core material is pre-formed into the desired reinforcement fiber shape. Fiber material is then deposited on the pre-formed core shape. In some embodiments, fiber material is deposited by Liquid Polymer Spinning, Chemical Vapor Deposition, Laser-driven Chemical Vapor Deposition or any other manufacturing technique used to make reinforcement fibers without a core. The resulting reinforcement fiber spirals, structures and shapes can be used with the system described in FIG. 6B to produce reinforced superconductors in the form of those spirals, structures and shapes. Both pre-pacified coated fiber or uncoated fiber can be used.

In some embodiments, the continuously produced HTS material from FIG. 6B will go through a secondary oxygen annealing separately in its completed form. In some embodiments, the oxygen annealing occurs during production as the material is drawn into a solid crystal structure, and a secondary chamber is introduced to flow oxygen across the HTS at temperatures appropriate for the material (e.g., 600° C. for some (RE)BCO). The crystals travel through the annealing chamber for an appropriate time dependent upon their thickness and other physical aspects including the component mixture and temperature.

Figure 7A:
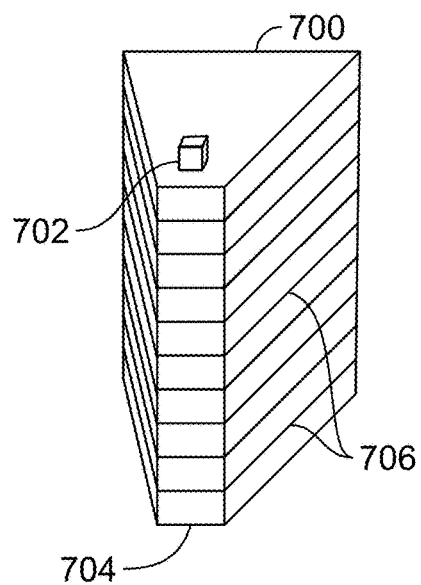
FIG. 7A is a diagram illustrating an embodiment of an electric junction.

FIG. 7A is a diagram illustrating an embodiment of an electric junction. In the example shown, because HTS have a defined a-b axes conducting planes (e.g., planes 706), the electric junction between a HTS and a standard conductor are designed to be mismatched in size. The standard conductor requires a much larger junction surface (e.g., back surface 700 compared to front surface 704) to pass a given current to the a-b conducting plane of an HTS. In some embodiments an HTS junction can be made by seeding (e.g., using seed crystal 702) a reinforced HTS component with different widths at its conducting ends.

Figure 7B:
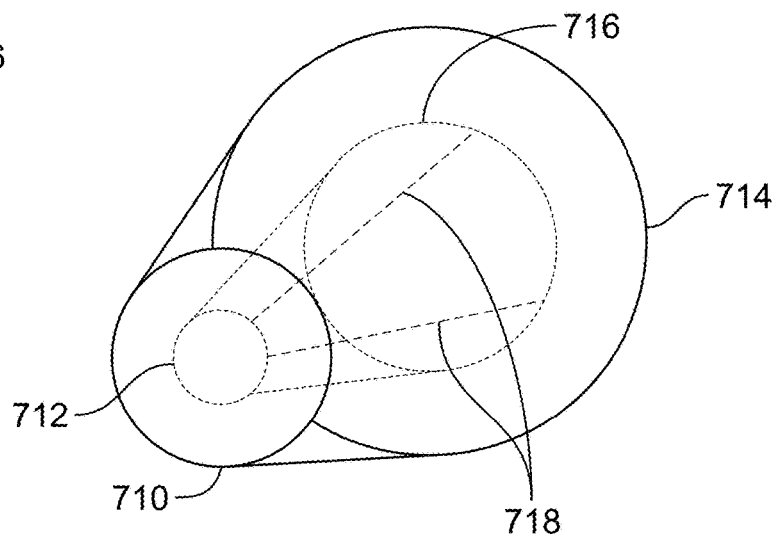
FIG. 7B is a diagram illustrating an embodiment of an electric junction.

FIG. 7B is a diagram illustrating an embodiment of an electric junction. In the example shown, radial c-axes seeding is used with fiber strands to make a radially symmetric (e.g., round diameter) HTS junction between a metal conductor and a standard electric conductor. The system described in FIG. 6B is used for continuous production. The HTS junction has one large diameter end (e.g., outer diameter large interface end 714) with a-b cone shapes (e.g., with large end 716) and the HTS junction has one small diameter end (e.g., outer diameter small interface end 710) with a-b cone shape (e.g., with small end 712). The junction has with the standard conductor which passes current to a smaller diameter end that in turn passes the same current on to the superconducting network. Both pre-pacified coated fiber or uncoated fiber (e.g., fibers 718) can be used as reinforcement in between the outer diameter large interface end 714 and outer diameter small interface end 710 and are disposed along the a-b cone shapes.

Figure 7C:
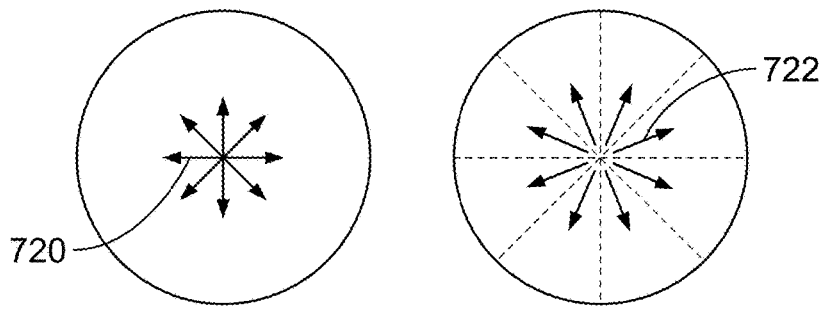
FIG. 7C is a diagram illustrating an embodiment of a HTS crystal with radial c-axis/non-planar axial a-b axes.

FIG. 7C is a diagram illustrating an embodiment of a HTS crystal with radial c-axis/non-planar axial a-b axes. In the example shown, a HTS crystal is produced with radial c-axes (e.g., axes 720) with non-planar axial a-b axes using a radial c-axis seed crystal (not shown). The radial c-axis seed crystal can be created by multi-seeding an HTS sample with an array of separate seed crystals whose c-axes 722 are oriented radially around the sample's center or by multi-seeding. The radial c-axes creates a HTS with cylindrical a-b conducting surfaces. The nonconducting c-axis will act to insulate electric current at the HTS surface when two radial c-axis HTS conductors are placed side by side.

Figure 8:
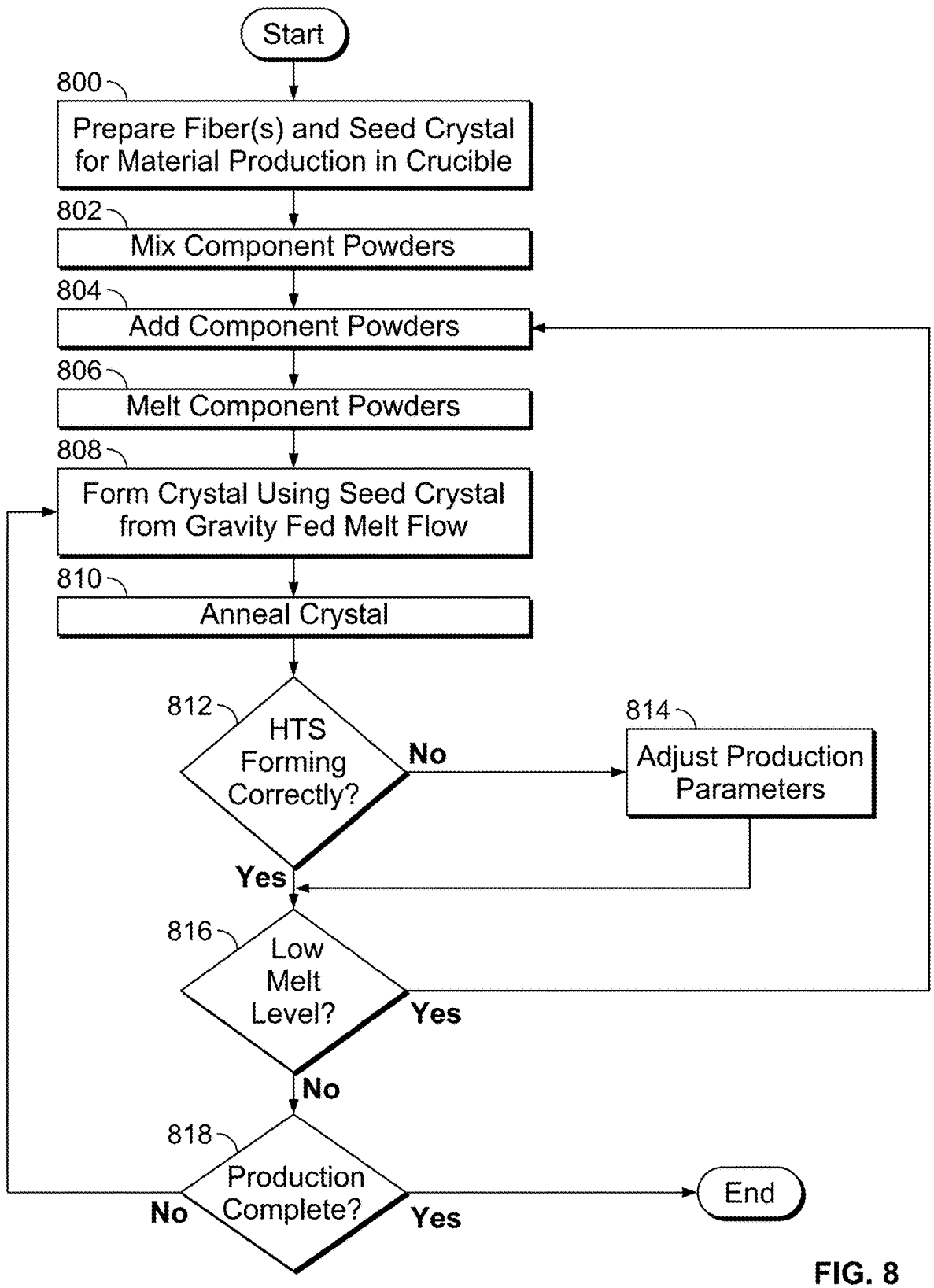
FIG. 8 is a flow diagram illustrating an embodiment of a process for continuous HTS production.

FIG. 8 is a flow diagram illustrating an embodiment of a process for continuous HTS production. In some embodiments, the process of FIG. 8 uses apparatus of FIG. 4 and/or apparatus of FIG. 5 to continuously produce HTS. In the example shown, in 800 fiber(s) and seed crystal are prepared for material production in the crucible. For example, fiber is threaded through spigot at bottom of crucible and attached to seed crystal and seed crystal holder. For example, seed crystal is mechanically (e.g., tied, clipped, clamped, etc.) and/or chemically (e.g., using an adhesive) attached to one or more fibers. In some embodiments, continuous production of material does not include reinforcement fibers and this step is omitted. In some embodiments, the seed crystal is grown attached to fiber. In some embodiments, the fiber comprises a complex fiber structure (e.g., braided fiber, multistranded fiber, chain of fiber, etc.).

In 802, component powders are mixed. For example, solid materials of correct ratios are mixed mechanically in preparation for adding to crucible for melting. In some embodiments, the component powders include one or more phases of materials.

In 804, the component powders are added. For example, the mix of component powders is added to a crucible for heating. In some embodiments, a monitoring system determines whether there is sufficient component powders in the crucible (e.g., by monitoring a material level in the crucible (e.g., using an optical sensor, using a weight sensor, etc.), and in response to there not being sufficient component powders, component powders are added to the crucible.

In 806, component powders are melted. For example, the crucible is heated to melt component powders. In some embodiments, a monitoring system determines whether the crucible or a zone of the crucible is at an appropriate temperature, and in response to the crucible or zone of the crucible not being at the appropriate temperature, controlling one or more heating elements to achieve the appropriate temperature in the crucible or zone of the crucible.

In 808, a crystal is caused to be formed using seed crystal from gravity fed melt flow. For example, melted component powder is gravity fed down a spigot at the bottom of the crucible and the melt makes contact with a seed crystal. Crystallization begins at the seed crystal (e.g., keeping the seed crystal's orientation) as the seed crystal is moved down (e.g., the seed crystal holder is moved down at a rate to create appropriate growth) in the crystallization neck. In some embodiments, the crystallization of the melt material is formed around the fiber attached to the seed crystal, which serves to reinforce the crystal.

In 810, the crystal is caused to be annealed. For example, below the crystallization neck the crystalized material is heated and exposed to a flow of oxygen to anneal the crystal to create HTS.

In 812, it is determined whether the HTS material has formed correctly. For example, production sensors are monitored to determine appropriate production quality. In various embodiments, sensors include temperature sensors, optical sensors, ultrasound sensors, x-ray sensors, tension sensors, weight sensors, or any other appropriate sensors. In response to determining that the HTS is not forming correctly, in 814 production parameters are adjusted, and control passes to 816. In various embodiments, production parameters include one or more heating coil temperatures, drop rate of seed crystal holder, cooling temperatures (e.g., for the crystallization neck and/or fibers, if appropriate, etc.), oxygen flow, material level in crucible, or any other appropriate production parameter. In response to determining that the HTS is forming correctly, control passes to 816.

In 816, it is determined whether the melt level is low. For example, a level of component powder is detected in the crucible (e.g., using an optical sensor) and in response to the level being below a threshold value, additional component powder is added to the crucible. In response to the melt level being low, control passes to 804. In response to the melt level not being low, control passes to 818.

In 818, it is determined whether production is complete. For example, a determination is made whether to continue or to stop production. In various embodiments, the determination of whether production is complete is based on one or more of the following: a length of material has been produced, a volume of material has been produced, an input level of material is below a threshold, a quality of material being produced, or any other appropriate criterion. In response to determining that production is complete, the process ends. In response to determining that production is not complete control passes to 808.

In some embodiments, seed crystals with radial c-axes can be used with the system described in 6B to produce reinforced HTS wires, rods, and cylinders with longitudinal conducting a-b planes and radial c-axes. Radial seed crystals with graduated curved reinforcement fiber can be used with the system described in 6B to produced HTS junctions with radial c-axes. Radial c-axes components offer insulation when components are placed side by side. Both pre-pacified coated fiber or uncoated fiber can be used.

In some embodiments, seeding with multiple crystal seeds on a lateral plane can produce a single crystal HTS with a lateral a-b plane.

In some embodiments, multi-seeding is used to grow single crystal HTS in complex fiber reinforcements between reinforcement fiber sections.

In some embodiments, multi-seeding is used to push impurities in reinforced HTS to the edges of a component.

In some embodiments, solenoids are produced from lateral a-b disks by: a) drilling out the centers of several lateral a-b disks, b) in each Disk making one cut from the center to the outside rim, c) offseting one side of the cut from the other so that two disks can be attached on the cut edges, and d) attaching cut disks sequentially at their offset cuts to produce an HTS solenoid.

In some embodiments, multiple seeding the circumference of a thin HTS component melt disk with seeds positioned with a radial c-axis, creates a disk with lateral a-b conducting plane.

In some embodiments, HTS solenoids are made by coring and swirl cutting radial c-axis cylinders. In some embodiments, reinforcing fiber positioned in a spiral form matching the eventual spiral cut can be used to add strength and heat control.

In some embodiments, by conducting heat through reinforcement fibers, it is possible to remelt then re-crystallize reinforced HTS. This allows repairs to broken crystal. This also allows the creation and reformation of reinforced HTS component geometries.

In some embodiments, fibers for HTS heat conduction are partly exposed in order to conduct internal heat from the HTS to the outside. Exposed fibers easily oxidize and burn during the high temperatures needed for sintering and crystallization of HTS crystal from component powders ($\approx 1200°$ C.). A method to protect those exposed fiber parts during such high temperatures from is to coat the exposed fiber with layers of a protective material which is removed from the exposed fiber once the HTS single crystal is formed and stabilized. The HTS component powders as well as crystallizing HTS single crystal will be protected from impurity contamination and secondary seeding where exposed fiber becomes part of the HTS component using Rare Earth material in a solvent such as ethanol.

In some embodiments, exposed fibers are protected from burning and oxidation during high heat by full submersion of the fibers and the objects they are attached to inert Noble gases comprising helium (He), neon (Ne), argon (Ar), krypton (Kr), xenon (Xe), radon (Rn) and/or Oganesson (Og), elemental gases with some inert properties like Nitrogen (N), and inert compound gases with Noble and elemental atomic components. These gases prevent oxygen from contacting exposed fiber thus preventing burning and oxidation. In some embodiments, gases which are heavier than air at atmospheric pressure for example argon (Ar), krypton (Kr), xenon (Xe), radon (Rn) and/or Oganesson (Og) are also easy to work with because they settle in the bottom of an open top container ensuring that an HTS component with exposed fiber is fully immersed. The inert gas will also prevent impurity contamination and secondary seeding where exposed fiber becomes part of the HTS component. In various embodiments, this method is applied to any exposed fiber and is not limited to fibers extruding or exposed during the production of reinforced HTS.

In some embodiments, reinforcement fiber has a Modulus of Elasticity much higher than pure HTS crystal. Internal fiber can thus be used to change the overall Modulus of Elasticity of fiber reinforced HTS from pure HTS. This change in Modulus of Elasticity can improve performance and acceptability to users. For example, one embodiment uses internal fiber reinforcement to change HTS Modulus of Elasticity to reduce the noise created by superconductors during MRI operation when electric currents cause superconductors to oscillate. This noise bothers and frightens patients causing them to move during the scan resulting in inaccurate MRI scans requiring repeated scanning. MRI noise reduction results in lower costs and patient discomfort.

Another embodiment would be to allow HTS to be manipulated more easily in forming shapes like solenoids than what the brittleness of pure HTS permits.

Another embodiment involves the manipulation of physical properties such as creating a more efficient Poisson expansion ratio for Earth-Space Tethers or creating stronger solenoid structures for dipole repulsion.

In some embodiments, laser melting uses lasers to melt HTS constituent powders on an existing base of single crystal HTS which acts as seed crystal for crystal formation of the melt. Reinforcing fibers can be placed within the constituent powders to create Reinforced HTS. Laser melting can allow high precision creation of small Reinforced HTS structures and components.

In some embodiments, large complex Reinforced HTS structures and components are created by moving lasers back and forth above previously created single crystal Reinforced HTS structures layers with added HTS component powders and reinforcement. This creates successive layers which together form a single crystal Reinforced HTS component. In some embodiments, the movement is controlled using a processor and one or more stages for moving the laser relative to the HTS component powders and reinforcement. In some embodiments, sensors (e.g., cameras, heat detectors, laser sensors, timers, etc.) are used to determine how long to dwell at a given location to optimize/control material processing. For example, temperatures or visual indicators are used in conjunction with timers to control dwell times over locations to produce optimal material processing results (e.g., appropriate heating or cooling for annealing of HTS, etc.). In some embodiments, the introduction of surrounding gases and/or other materials is also controlled by the processor and or determined using sensor indications as appropriate.

In some embodiments, laser melting is used to repair cracks and defects in existing reinforced HTS components. The defect or crack is cleaned by removing excess material down to the existing single crystal HTS base. HTS component powders are added or inserted into the defect or crack along with reinforcement fiber. Lasers are used to melt the component powders which then crystallize repairing the crack or defect with the existing single crystal HTS base acting as seed crystal. In some embodiments, the movement of the laser is controlled using a processor and one or more stages for moving the laser relative to the repair area. In some embodiments, the system removes excess, adds HTS component powders and reinforcement, and melts based on sensor input readings. In some embodiments, sensors (e.g., cameras, heat detectors, laser sensors, timers, etc.) are used to determine how long to dwell at a given location to optimize/control material processing. For example, temperatures or visual indicators are used in conjunction with timers to control dwell times over locations to produce optimal material processing results (e.g., appropriate heating or cooling for annealing of HTS, etc.). In some embodiments, the introduction of surrounding gases and/or other materials is also controlled by the processor and or determined using sensor indications as appropriate.

In some embodiments, passivation materials are elements, their compounds and their composites which react with gases (e.g., but not limited to, oxygen, carbon dioxide, etc.) and/or liquids (e.g., but not limited to: water, liquid tin, lead, zinc, mercury and their alloys, etc.) to form a durable compound layer preventing further reactions with the material. Passivation Materials include, but is not limited to, materials such as Silicon, Aluminum, Manganese, Zinc, Chromium, Nickel and their compounds, alloys and composites. In some embodiments, silicon carbide (SiC) is used as a Passivation Material.

In some embodiments, when in contact with HTS and HTS component powders during sintering and oxidation, Passivation Materials form a durable layer preventing further reactions between the passivation material and the HTS and HTS component powders. This durable layer prevents the formation of secondary crystallization and other forms of contamination in the finished HTS single crystal which can disrupt superconductivity and reduce HTS strength.

In some embodiments, passivation materials in the form of points, bristles, stands, rods whether of circular, square, or any other geometric cross section, tubes, cylinders, wires, braids, threads, cables, nets, meshes, springs, coils, columns, posts, or any other form and/or structure which supports the weight and/or form of the HTS and HTS component powders during sintering and oxidation. The use of passivation materials to support HTS and HTS component powders during sintering and crystallization reduces secondary crystallization and contamination, reducing waste production and lowering production costs. In various embodiments, passivation materials comprise one or more of the following: Silicon (e.g., including SiC), Aluminum, Chromium, Nickel, or any other appropriate passivation material. In some embodiments, the passivation materials form oxides.

In some embodiments, continuous production, passivation materials in forms such as rods, wheels, tubes, and cylinders are used to provide a support base for HTS and HTS component powders as they move through the production process. Such Passivation Materials can be mounted on rotating bearings, attached to motors to facilitate movement of the HTS and HTS component powders they support, or installed as reusable rollers to minimize movement friction. Forms for the Passive Material may include but are not limited to solid rods and cylinders, hollow rods and cylinders, wheels, bristles, etc. The use of Passivation Materials to support the weight and movement of HTS and HTS component powders improves Continuous Production in three ways: 1) reduces secondary crystallization and contamination where material makes contact with HTS and HTS component powders, b) reduces friction against HTS and HTS component powders are they move through the continuous sintering and crystallization process, and c) can help propel HTS and HTS component powders through the continuous sintering and crystallization process thus relieving the tension required on the Reinforced HTS to pull materials through Continuous Production. These processes together reduce secondary crystallization, contamination, and other defects as well as allow faster production speeds which reduce productions costs.

In some embodiments, passivation materials used to support HTS and HTS component powders as well as Passivation Materials used in reinforcement fibers (in some embodiments the Passivation Material SiC is used as fibers or as coats on fibers) are heated to prevent HTS secondary crystallization and contamination during both Continuous Production as well as Batch Production. Heating supports and reinforcement fibers ensures that the HTS touching the supports and reinforcement fiber material will not crystallize before the main single crystal being formed thus preventing secondary crystallization and contamination. This reduces defects, improves production quality, and thus reduces production cost.

In some embodiments, radiant heat is used to heat Passivation Support Material and Exposed Reinforcement Fiber without the need for physical coupling with a heat source. This reduces the need for handling equipment and boosts efficiency especially when HTS and HTS component powders move during production such as in Continuous Production. These methods reduce production costs.

In some embodiments, radiant heat also allows Passivation Support Material and Reinforcement Fiber to be maintained at different temperatures from HTS and HTS component powders during production. This is because extra Radiant heat can be directed specifically to Support Material and Exposed Reinforcement Fiber rather than HTS and HTS Component Powders during sintering. In some embodiments the temperature of Passivation Support Material and Reinforcing Fiber can be maintained above the temperature of HTS and HTS Component Powders leading to less secondary crystallization and HTS crystal contamination. This again reduces production costs.

In some embodiments, reinforced bulk HTS can be replace HTS tapes and wires in Superconducting Fault Control Limiters (SFCLs) providing more current carrying capacity. This will improve both Resistive SFCL and Inductive SFCL performance and reduce costs in three ways:

1. Reinforced HTS components can be made with much larger cross-section than HTS tapes used now permitting much higher current capacity.
2. In Resistive SFCLs reinforced HTS will generate less sporadic heat that leads to HTS tape burnout and failure. This is because reinforced HTS does not have the metallic conductor substrate of HTS tapes. This substrate generates heat if current leaks out of the thin HTS layer deposited on the substrate. HTS tapes permanently burn when defects generating destructive heat. This stops the transient superconductivity necessary for SFCL. Reinforced HTS does not have a conducting substrate to generate such destructive heat. When current is too high and temperatures exceed critical superconductor operating temperature, reinforced HTS stops superconducting and the current is immediately cut off stopping more heat generation. When the current returns to normal levels and temperatures are below operating level, reinforced HTS resumes superconducting automatically. Temperatures never reach destructive levels.
3. In Inductive SFCLs, HTS is used as a cylinder. The cylinder is subject to strong radial forces created by magnetic Lorenz forces when in operation. These radial forces cause the HTS cylinder to break. reinforced HTS cylinders can carry more current before bursting than other HTS used previously in inductive SFCLs such as BSCCO.

In some embodiments, reinforced HTS magnetic components and solenoids can create much stronger magnetic forces than currently used metal-based electromagnets with less electric power and less weight. Nitrogen cooled HTS also can create stronger magnetic fields at lower costs than helium cooled Low Temperature Superconductors (LTS). Reinforced HTS can therefore create stronger and more efficient magnetic bearings between two ferromagnetic surfaces.

In some embodiments, HTS Magnetic Bearings in gyroscopes and gyroscopic vehicles such as satellites use spinning rings, typically made of ferromagnetic material, to maintain angular momentum. Gyroscope quality is raised with higher angular momentum through higher spin rate and/or ring weight. Reinforced HTS magnetic bearings provide stronger magnetic support with less friction and less energy allowing production of higher quality gyroscopes with cheaper production and operating costs.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   one or more fibers, wherein the one or more fibers comprise silicon carbide (SiC) fiber;
   a crucible, wherein the crucible includes a spigot at a bottom end and a cap at a top end;
   a heating element, wherein the heating element is configured to heat the crucible;
   a crystallization neck, wherein the crystallization neck is configured to receive the one or more fibers and melted material from the crucible through the spigot, and wherein the crystallization neck provides an output opening for the one or more fibers and crystalized material; and
   a seed crystal holder, wherein the seed crystal holder is configured to hold a high temperature superconductor (HTS) seed crystal in contact with material from the crucible to seed crystal growth, wherein the seed crystal is attached to a fiber of the one or more fibers, and wherein the one or more fibers extend through a cap hole of the cap.

2. The system of claim 1, wherein the crucible comprises alumina.

3. The system of claim 1, wherein the crucible comprises an inner crucible and an outer crucible.

4. The system of claim 3, wherein the heating element is disposed between the inner crucible and the outer crucible.

5. The system of claim 1, wherein the heating element is one of a plurality of heating elements.

6. The system of claim 5, wherein a first heating element of the plurality of heating elements heats to a first temperature and a second heating element of the plurality of heating elements heats to a second temperature.

7. The system of claim 1, wherein the cap is removable and encloses the top end of the crucible to capture heat inside the crucible.

8. The system of claim 1, further comprising one or more sensors for temperature control, wherein data from the one or more sensors is used to adjust crystallization in the crystallization neck.

9. The system of claim 1, wherein the seed crystal holder further comprises a fiber holder for holding a fiber of the one or more fibers.

10. The system of claim 1, wherein the one or more fibers comprise pre-pacified SiC fibers.

11. The system of claim 1, wherein the one or more fibers are heated, cooled, and/or temperature controlled before the crucible and/or after the crystallization neck.

12. The system of claim 1, wherein the one or more fibers are prestressed using the seed crystal holder.

13. The system of claim 1, further comprising a cylinder, wherein the cylinder creates a solenoid from the crystalized material output from the crystallization neck.

14. The system of claim 13, wherein the cylinder is rotated and translated to mold the solenoid.

15. The system of claim 13, further comprising one or more outer rollers used to maintain contact of the crystalized material output from the crystallization neck with the cylinder.

16. The system of claim 1, further comprising an annealer, wherein the annealer provides an oxygen flow to anneal the crystalized material.

17. The system of claim 16, wherein the annealer provides a heated environment to anneal the crystalized material.

18. A system, comprising:
   a container, wherein the container is configured to receive one or more fibers and to hold melted component powders, wherein the one or more fibers comprise silicon carbide (SiC) fiber; and
   a seed crystal holder, wherein the seed crystal holder is configured to hold a high temperature superconductor (HTS) seed crystal, wherein the seed crystal is attached to a fiber of the one or more fibers, wherein the seed crystal holder is configured to put the seed crystal in contact with the melted component powders, wherein the seed crystal holder moves the seed crystal to grow a crystal from the melted component powders, and wherein the crystal is formed around the one or more fibers.

* * * * *